(12) United States Patent
Pillarisetty et al.

(10) Patent No.: US 7,820,512 B2
(45) Date of Patent: Oct. 26, 2010

(54) SPACER PATTERNED AUGMENTATION OF TRI-GATE TRANSISTOR GATE LENGTH

(75) Inventors: Ravi Pillarisetty, Portland, OR (US); Suman Datta, Port Matilda, PA (US); Jack Kavalieros, Portland, OR (US); Brian S. Doyle, Portland, OR (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/006,063

(22) Filed: Dec. 28, 2007

(65) Prior Publication Data

US 2009/0168498 A1   Jul. 2, 2009

(51) Int. Cl.
*H01L 21/8234* (2006.01)
*H01L 21/336* (2006.01)
*H01L 21/311* (2006.01)

(52) U.S. Cl. .............. 438/275; 438/283; 438/696; 257/E27.098; 257/E21.661

(58) Field of Classification Search .......... 438/229, 438/275, 276, 278, 279, 283, 284, 299, 696; 257/903, E27.098, E21.661
See application file for complete search history.

(56) References Cited

U.S. PATENT DOCUMENTS

| 5,464,784 | A  | * | 11/1995 | Crisenza et al. | 438/275 |
| 5,719,509 | A  | * | 2/1998  | Chan            | 327/112 |
| 6,096,611 | A  | * | 8/2000  | Wu              | 438/289 |
| 6,218,241 | B1 | * | 4/2001  | Chuang          | 438/253 |
| 6,458,646 | B1 | * | 10/2002 | Divakaruni et al. | 438/241 |
| 2004/0195608 | A1 | * | 10/2004 | Kim et al.    | 257/296 |
| 2005/0062161 | A1 | * | 3/2005  | Chen et al.   | 257/758 |
| 2005/0121676 | A1 | * | 6/2005  | Fried et al.  | 257/72  |
| 2007/0093054 | A1 | * | 4/2007  | Min et al.    | 438/637 |
| 2008/0128796 | A1 | * | 6/2008  | Zhu et al.    | 257/328 |
| 2008/0191282 | A1 | * | 8/2008  | Bauer et al.  | 257/365 |

* cited by examiner

*Primary Examiner*—Hsien-ming Lee
*Assistant Examiner*—Kevin Parendo
(74) *Attorney, Agent, or Firm*—Ryder, Lu, Mazzeo and Konieczny, LLC; Douglas J. Ryder

(57) ABSTRACT

In general, in one aspect, a method includes forming a semiconductor substrate having N-diffusion and P-diffusion regions. A gate stack is formed over the semiconductor substrate. A gate electrode hard mask is formed over the gate stack. The gate electrode hard mask is augmented around pass gate transistors with a spacer material. The gate stack is etched using the augmented gate electrode hard mask to form the gate electrodes. The gate electrodes around the pass gate have a greater length than other gate electrodes.

12 Claims, 5 Drawing Sheets

SPACER PATTERNED AUGMENTATION OF TRI-GATE TRANSISTOR GATE LENGTH

BACKGROUND

Six transistor static random access memory (6T SRAM) cells require sufficient static noise margin (SNM) to maintain cell stability during read operations. The SNM is proportional to the beta ratio (BR) of the 6T SRAM cell, where the BR is the ratio of the conductivity (impedance (Z) divided by the length (L)) of the pull down transistor (PD) to the conductivity of the pass gate transistor (PG), such that $BR=(Z_{PD}/L_{PD})/(Z_{PG}/L_{PG})$. In 6T SRAM cells made from planar transistors, stability may be achieved through appropriate transistor sizing of the PG relative to the PD to obtain a beta ratio to provide sufficient SNM (geometrically defined SNM).

Non-planar (e.g., tri-gate) transistors have different device physics than planar transistors. For example, increasing the Z of a non-planar transistor may significantly degrade performance and short channel effects of the device. Accordingly, 6T SRAM cells made from non-planar transistors require the PG and PD to have substantially the same Z ($Z_{PD}=Z_{PG}$).

Furthermore, as technology continues to be scaled to smaller and smaller sizes the scaled gate length and gate pitch required for future generation SRAM cells may have significant lithographic restrictions imposed and require uniform patterning. This may result in SRAM cells with identical gate lengths for the pass and pull-down transistors ($L_{PD}=L_{PG}$).

BRIEF DESCRIPTION OF THE DRAWINGS

The features and advantages of the various embodiments will become apparent from the following detailed description in which.

DETAILED DESCRIPTION

Figure 1:
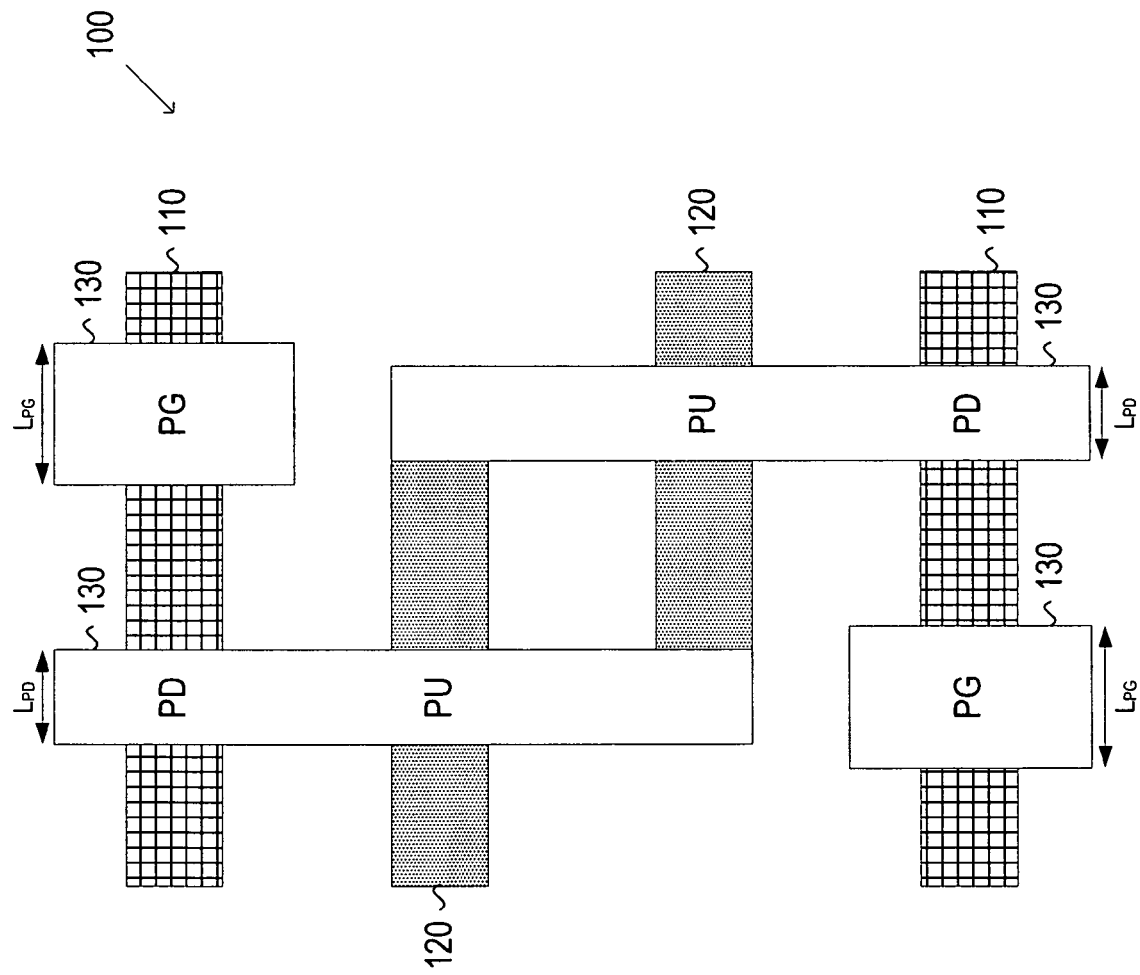
FIG. 1 illustrates a layout of an example non-planar (tri-gate) 6T SRAM cell, according to one embodiment.

FIG. 1 illustrates a layout of an example non-planar (tri-gate) 6T SRAM cell 100. The cell 100 includes N-diffusion regions (fins) 110, P-diffusion regions (fins) 120, and gate electrodes 130. The gate electrodes 130 wrap around the sides and top of the respective regions 110, 120 to form two tri-gate pull-up transistors (PU), two tri-gate pull-down transistors (PD) and two tri-gate pass-gate transistors (PG). As illustrated, the length of the PG ($L_{PG}$) is greater than the length of the PD ($L_{PD}$). As the impedance of the PG and PD are substantially the same ($Z_{PD}=Z_{PG}$) the conductivity of the PD will be greater than the conductivity of the PG and the beta ratio will be increased for increased static noise margin (SNM).

Figure 2:
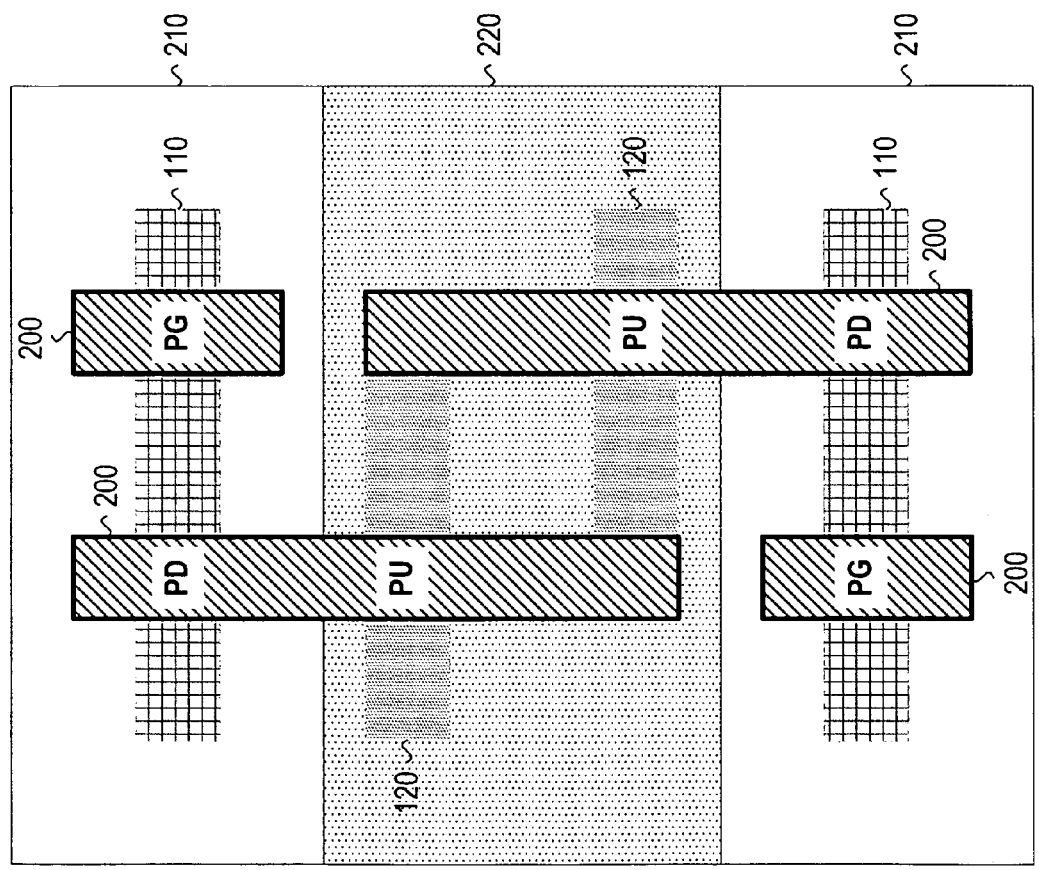
FIG. 2 illustrates an example substrate in which N-diffusion fins and P-diffusion fins are formed, according to one embodiment.

FIGS. 2-5 illustrate the process for increasing the $L_{PG}$ for the example non-planar 6T SRAM cell 100. FIG. 2 illustrates an example substrate in which the N-diffusion fins 110 and P-diffusion fins 120 are formed. The fins 110, 120 may be formed through any number of known processes. A gate dielectric layer (e.g., nitride, oxide, high dielectric constant (K) material) may be formed over the entire substrate (not illustrated). An N-diffusion gate stack layer 210 is formed over a region of the substrate (on the dielectric layer) having the N-diffusion fins 110 and a P-diffusion gate stack layer 220 is formed over a region of the substrate having the P-diffusion fins 120. Note that the fins 110, 120 are illustrated in gray to signify they are covered by the gate stack layers 210, 220.

The gate stack layers 210, 220 may be formed through any number of known processes. For example, a P-diffusion layer may be formed on the gate dielectric layer over the entire substrate. A resist layer may be formed over the P-diffusion layer and then patterned (e.g., lithography) over the P-diffusion region. An etch may be performed to remove the P-diffusion layer where not protected by the mask (over the N-diffusion region). The resist layer may be removed and an N-diffusion layer may then be formed over the entire substrate. The P-diffusion gate stack layer 220 may include the P-diffusion layer and the N-diffusion layer while the N-diffusion gate stack layer 210 may simply include the N-diffusion layer.

A hard mask may be formed over the entire substrate and then patterned to form a gate electrode hard mask 200. The various tri-gate transistors that will be formed (2 PG, 2 PD, 2 PU) once the gate electrodes are formed are identified. The formation and patterning of the hard mask may be performed through any number of known processes. For example, a resist layer may be patterned (e.g., lithography) on the hard mask layer and then the hard mask may be etched to create the gate electrode hard mask 200 and the resist layer may be removed. Lithographic patterning for gate lengths associated with tri-gate devices may require uniform patterns so that the resultant gate electrode hard mask 200 includes uniform patterns.

Figure 3:
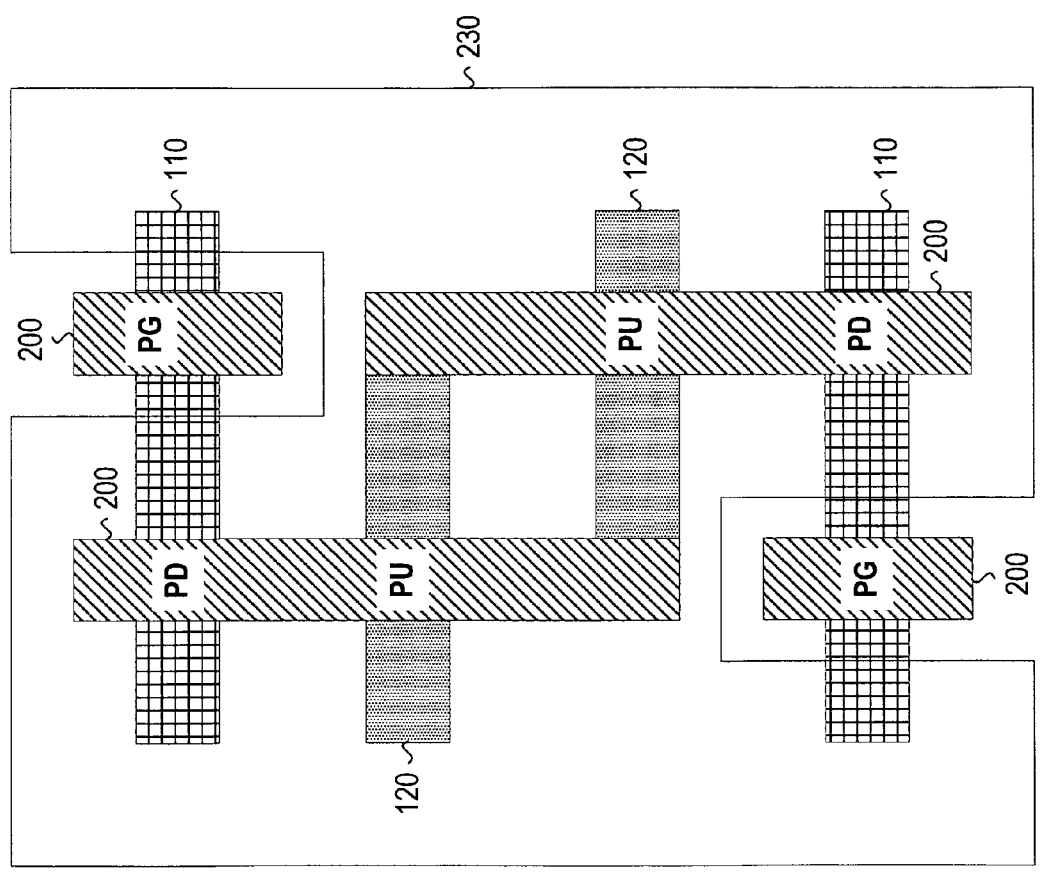
FIG. 3 illustrates the example substrate after a blocking layer is blanketed across the entire substrate and is etched out around the pass gates, according to one embodiment.

FIG. 3 illustrates the example substrate after a blocking layer (e.g., oxide) 230 is blanketed across the entire substrate and is etched out around the PGs. The formation and etching of the blocking layer 230 may be performed through any number of known processes. For example, in order to etch the blocking layer 230 a resist layer may be formed on the blocking layer 230 and then patterned (e.g., lithography) to leave the area around the PGs exposed so that it can be etched. It should be noted that for ease of illustration the gate stack layers 210, 220 are not illustrated in FIGS. 3-5.

Figure 4:
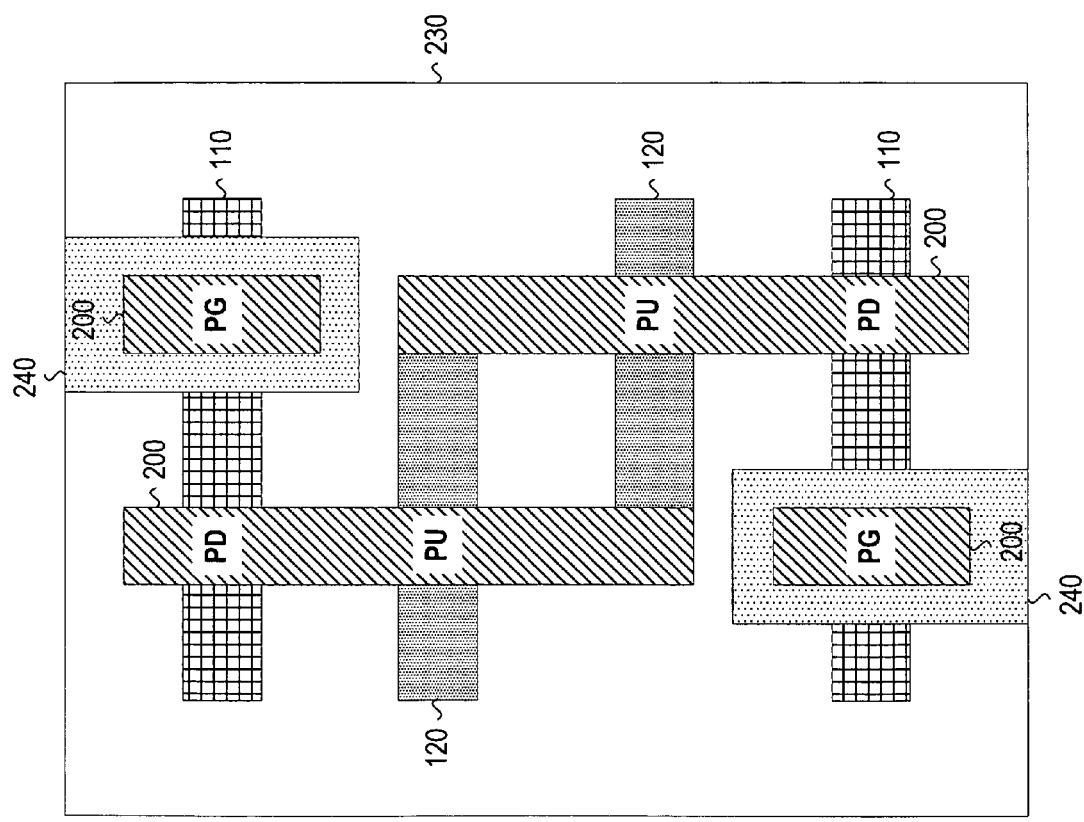
FIG. 4 illustrates the example substrate after a conformal spacer material is formed around the pass gates, according to one embodiment.

FIG. 4 illustrates the example substrate after a conformal spacer material 240 is formed around the PGs (in the patterned/etched area of the blocking layer 230). The formation of the spacer material 240 around the PG may be performed through any number of known processes.

Figure 5:
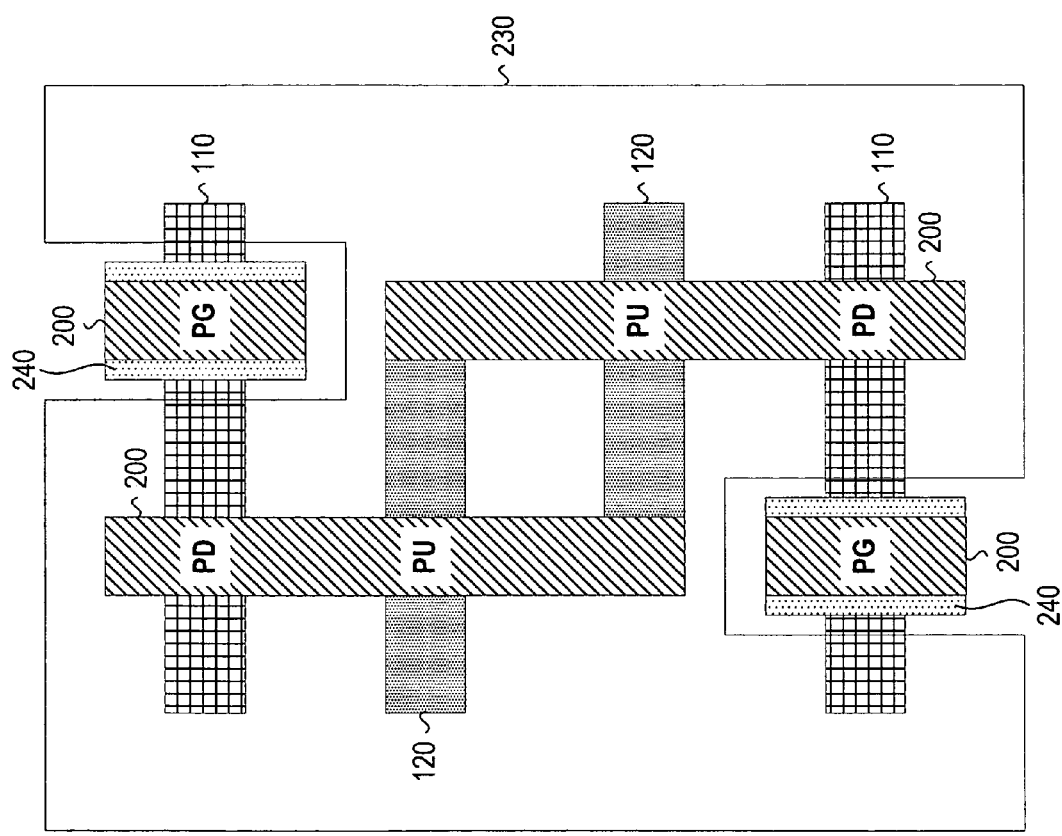
FIG. 5 illustrates the example substrate after the spacer material has been etched and the residue remains on the sidewalls of the gate electrode hard mask over the N-diffusion fins, according to one embodiment.

FIG. 5 illustrates the example substrate after the spacer material 240 has been etched and the residue remains on the sidewalls of the gate electrode hard mask 200 over the N-diffusion fins 110. The etching of the spacer material 240 around the PG may be performed through any number of known processes.

The blocking layer 230 is then removed leaving the gate electrode hard mask 200 augmented by the spacer material 240 around the PGs. The gate stack layers 210, 220 are then etched using the gate electrode hard mask 200 augmented by the spacer material 240 as the pattern. The result is the 6T SRAM cell 100 of FIG. 1 where the length of the PGs is larger than the length of the PDs resulting in a higher beta ratio and a higher SNM.

It should be noted that the process of FIGS. 2-5 utilized the spacer material to augment the tri-gate PG gate length with respect to the tri-gate PD gate length in a 6T SRAM cell but the process is not limited thereto. Rather, the process could be utilized to increase a tri-gate transistor gate length in relation to other tri-gate transistor gate lengths in any type of circuit where increasing the relative length is beneficial.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising
forming a semiconductor substrate having N-diffusion fins and P-diffusion fins, wherein the N-diffusion fins and P-diffusion fins traverse the substrate in a first direction;
forming a gate stack over the semiconductor substrate;
forming a gate electrode hard mask over the gate stack, wherein the gate electrode hard mask traverses the substrate in a second direction substantially perpendicular to the first direction and defines gate electrodes for a six transistor static random access memory (6T SRAM) that includes pull-up transistors, pull-down transistors and pass-gate transistors, wherein a first portion of the gate electrode hard mask utilized to define the pull-up transistor gate electrodes is formed over the P-diffusion fins, a second portion of the gate electrode hard mask utilized to define the pull-down transistor gate electrodes is formed over the N-diffusion fins and is connected to the first portion of the gate electrode hard mask, and a third portion of the gate electrode hard mask utilized to define the pass-gate transistor gate electrodes is formed over the N-diffusion fins, wherein each portion of the gate electrode hard mask has a substantially same width such that a same amount of each of the N-diffusion and the P-diffusion fins is covered thereby;
forming spacers on sidewalls of the third portion of the gate electrode hard mask to form an augmented gate electrode hard mask where the width of the third portion of the augmented gate electrode hard mask is wider than the first and second portions of the augmented gate electrode hard mask; and
etching the gate stack using the augmented gate electrode hard mask to form the gate electrodes, wherein the pass-gate transistor gate electrodes have a greater width than the pull-up transistor gate electrodes and the pull-down transistor gate electrodes so the pass-gate transistors have longer gate lengths than the pull-up transistors and the pull-down transistors.

2. The method of claim 1, wherein the forming the gate stack includes forming a P-diffusion gate stack over the P-diffusion fins and an N-diffusion gate stack over the N-diffusion fins.

3. The method of claim 2, wherein the forming the P-diffusion gate stack includes forming the P-diffusion gate stack having a P-diffusion layer and an N-diffusion layer.

4. The method of claim 2, wherein the forming the P-diffusion gate stack and the N-diffusion gate stack includes forming the P-diffusion gate stack and the N-diffusion gate stack having same impedance.

5. The method of claim 1, further comprising forming a dielectric layer on the semiconductor substrate, wherein the forming the gate stack includes forming the gate stack over the dielectric layer.

6. The method of claim 1, wherein the forming the gate electrode hard mask includes
forming a hard mask layer over the gate stack;
patterning a resist layer over the hard mask layer; and
etching the hard mask layer.

7. The method of claim 6, wherein
the patterning includes uniform lithographic patterning, and
the etching results in the gate electrode hard mask having uniform patterns.

8. The method of claim 1, wherein the forming spacers includes
forming a blocking layer over the substrate including over the gate stack and the gate electrode hard mask;
removing the blocking layer around the third portion of the gate electrode hard mask;
forming a spacer material around the third portion of the gate electrode hard mask;
etching the spacer material, wherein unetched portions of the spacer material remains on edges of the third portion of the gate electrode hard mask; and
removing the blocking layer.

9. A method comprising
forming a semiconductor substrate having N-diffusion fins and P-diffusion fins, wherein the N-diffusion fins and P-diffusion fins traverse the substrate in a first direction;
forming a P-diffusion gate stack over the P-diffusion fins and an N-diffusion gate stack over the N-diffusion fins, wherein the P-diffusion gate stack and the N-diffusion gate stack have same a impedance;
forming a gate electrode hard mask over the P-diffusion and N-diffusion gate stacks, wherein the gate electrode hard mask traverses the substrate in a second direction substantially perpendicular to the first direction and defines gate electrodes for a six transistor static random access memory (6T SRAM) that includes pull-up transistors, pull-down transistors and pass-gate transistors, wherein a first portion of the gate electrode hard mask utilized to define the pull-up transistor gate electrodes is formed over the P-diffusion fins, a second portion of the gate electrode hard mask utilized to define the pull-down transistor gate electrodes is formed over the N-diffusion fins and is connected to the first portion of the gate electrode hard mask, and a third portion of the gate electrode hard mask utilized to define the pass-gate transistor gate electrodes is formed over the N-diffusion fins, wherein each portion of the gate electrode hard mask has a substantially same width;
forming spacers on sidewalls of the third portion of the gate electrode hard mask to augment the third portion of the gate electrode hard mask so that the width of the augmented third portion of the gate electrode hard mask is wider than the first and second portions; and
etching the P-diffusion gate stack and the N-diffusion gate stack using the gate electrode hard mask with the augmented third portion to form the gate electrodes, wherein the pass-gate transistor gate electrodes have a greater width than the pull-up transistor gate electrodes and the pull-down transistor gate electrodes.

10. The method of claim 9, further comprising forming a dielectric layer on the semiconductor substrate, wherein the forming the P-diffusion gate stack and the N-diffusion gate stack includes forming the P-diffusion gate stack and the N-diffusion gate stack over the dielectric layer.

11. The method of claim 9, wherein the forming the gate electrode hard mask includes
    forming a hard mask layer over the P-diffusion gate stack and the N-diffusion gate stack;
    patterning a resist layer over the hard mask layer; and
    etching the hard mask layer.

12. The method of claim 9, wherein the forming spacers includes
    forming a blocking layer over the substrate including over the P-diffusion gate stack, the N-diffusion gate stack and the gate electrode hard mask;
    etching the blocking layer to remove a portion of the blocking layer around the third portion of the gate electrode hard mask;
    forming a spacer material around the third portion of the gate electrode hard mask;
    etching the spacer material, wherein unetched portions of the spacer material remains on edges of the third portion of the gate electrode hard mask; and
    removing the blocking layer.

\* \* \* \* \*

UNITED STATES PATENT AND TRADEMARK OFFICE
CERTIFICATE OF CORRECTION

PATENT NO. : 7,820,512 B2
APPLICATION NO. : 12/006063
DATED : October 26, 2010
INVENTOR(S) : Ravi Pillarisetty et al.

Page 1 of 1

It is certified that error appears in the above-identified patent and that said Letters Patent is hereby corrected as shown below:

In column 4, line 35, in claim 9, delete "same a" and insert -- a same --, therefor.

Signed and Sealed this
First Day of February, 2011

David J. Kappos
*Director of the United States Patent and Trademark Office*